United States Patent
Otaka et al.

[11] Patent Number: 5,150,208
[45] Date of Patent: Sep. 22, 1992

[54] ENCODING APPARATUS

[75] Inventors: Hideki Otaka, Neyagawa; Masakazu Nishino, Kashiwara; Tatsuro Juri, Osaka, all of Japan

[73] Assignee: Matsushita Electric Industrial Co., Ltd., Osaka, Japan

[21] Appl. No.: 777,015

[22] Filed: Oct. 16, 1991

[30] Foreign Application Priority Data

Oct. 19, 1990 [JP] Japan ................................ 2-282121
Nov. 13, 1990 [JP] Japan ................................ 2-307388

[51] Int. Cl.$^5$ ........................................... H04N 2/133
[52] U.S. Cl. ................................. 358/133; 358/160
[58] Field of Search .............................. 358/133, 160

[56] References Cited

U.S. PATENT DOCUMENTS 4,517,596 5/1985 Suzuki ................................. 358/133
5,073,821 12/1991 Juri ..................................... 358/133

Primary Examiner—Howard W. Britton
Attorney, Agent, or Firm—Wenderoth, Lind & Ponack

[57] ABSTRACT

A maximum value of each block after orthogonal transformation is detected, and an output word length after orthogonal transformation is controlled in accordance with the maximum value thus detected. In addition, a plurality of tables each having a plurality of quantizers combinedly used are prepared and a table is selected in accordance with the maximum value of each block, thereby selecting the optimum quantizer in accordance with the data amount thus generated.

10 Claims, 4 Drawing Sheets

ENCODING APPARATUS

BACKGROUND OF THE INVENTION

1. Field of the Invention

This invention relates an encoding apparatus using orthogonal transformation.

2. Description of the Prior Art

Generally, when video signals are to be recorded or transmitted, a method of reducing information amount by the high efficiency encoding technology has been used as a powerful means because the information amount is extremely large. Here, as an example of the compression high efficiency encoding technology, there has been known orthogonal transformation such as, for example, the Hadamard transformation and discrete cosine transformation (DCT). With the orthogonal transformation encoding technology, inputted video signals are blocked, frequency-divided in block unit to obtain frequency components and the frequency components thus obtained are respectively encoded, thus reducing the information amount to be allocated to the high frequency component with less influence on visual deterioration. As a result, the information amount of the original video signal can be reduced.

However, a conventional encoding apparatus has the following problems;

The accuracy of orthogonal transformation depends on the output word length after orthogonal transformation. On the one hand, when the output word length is large, the accuracy of transformation is improved, and though deterioration due to transformation or inverse transformation becomes small, the number of quantizers and the scale of an encoding table to be used become large for the reason that dynamic range becomes large, resulting in the increase of the circuit scale for encoding. On the other hand, when the output word length of orthogonal transformation is small, for the reason that the dynamic range becomes small, the circuit scale for encoding can be made small, but an enough accuracy cannot be obtained in performing transformation and inverse transformation.

In addition, referring to the quantizers to be used, the number of them becomes large, and the accuracy of encoding can be improved by selecting the quantization width finely. However, when m quantizers are used, it is required to calculate the data amount when m kinds of quantization are carried out for each block, which means that the circuit scale for encoding becomes large with an increase in the kind of quantizer to be used.

SUMMARY OF THE INVENTION

An object of this invention is to provide an encoding apparatus in which the accuracy of orthogonal transformation can be ensured by increasing the output word length of orthogonal transformation and yet the circuit scale for encoding can be practically reduced.

In order to attain the above-mentioned object, an encoding apparatus of this invention comprises a blocking circuit for collecting sampled values of an input signal to obtain blocks of sampled values, an orthogonal transformation circuit for orthogonally transforming sampled values of each block to obtain orthogonal components, a detection circuit for detecting amplitudes of components excepting direct-current component out of the orthogonal components obtained by the orthogonal transformation circuit, a first quantizer circuit for quantizing the orthogonal components only when an amplitude detected by the detection circuit exceeds a predetermined value, a second quantizer circuit for quantizing the data obtained by the first quantizer circuit in accordance with the amplitudes detected by the detection circuit, and an encoder circuit for encoding data obtained by the second quantizer circuit.

Another encoding apparatus of this invention comprises a large blocking circuit for collecting the sampled values of an input signal to obtain large blocks of sampled values, a small blocking circuit for dividing each large block into a plurality of small blocks, an orthogonal transformation circuit for orthogonally transforming each of said plurality of small blocks to obtain orthogonal components, m quantizer circuits for quantizing the orthogonal components obtained by the orthogonal transformation circuit with m kinds of quantization widths, a quantizer circuit table selection circuit for selecting one of a plurality of quantizer circuit tables each showing a combination of n stages of quantizer circuits selected from the m quantizer circuits for each small block, a data amount calculation circuit for calculating a data amount after quantization of each small block by the n stages of quantizer circuits, a quantizer circuit selection circuit for selecting, using the data amount obtained by the data amount calculation circuit, an optimum quantization width for each small block to make a data amount constant in every large block, a quantizer circuit for quantizing the orthogonal components using the optimum quantization width selected by the quantizer circuit selection circuit, and an encoder circuit for encoding quantized values obtained by the quantizer circuit.

With the arrangements as shown above, an encoding apparatus of the invention detects a value maxAC of the orthogonal components after orthogonal transformation, and for a block in which the value max AC exceeds a predetermined value, a first quantization is performed to limit the dynamic range, and a second quantization is made to perform encoding. Next, for a block in which the value maxAC does not exceed the predetermined value, the second quantization is directly performed to perform encoding.

In addition, by calculating the data amount after encoding in advance, quantization is performed using an optimum quantizer circuit, and by selecting a table showing a combination of n stages of quantizer circuits selected from m quantizer circuits for every small block, the data amount after encoding is calculated.

DESCRIPTION OF THE PREFERRED EMBODIMENTS

Figure 1:
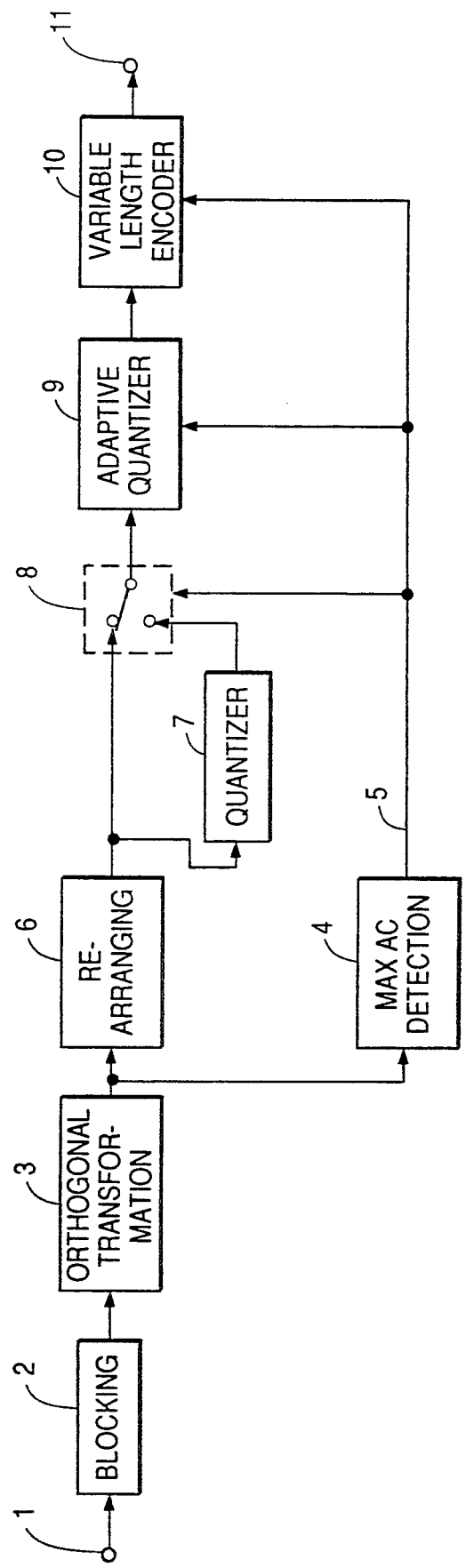
FIG. 1 is a block diagram of an encoding apparatus according to a first embodiment of this invention.

Embodiments of this invention will be described below by referring to the drawings attached.

Figure 2:
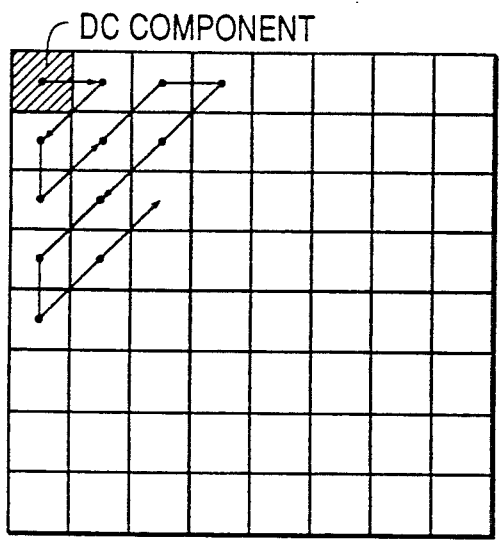
FIG. 2 is an explanatory diagram of a method of rearranging a re-arranging circuit shown in FIG. 1.

FIG. 1 is a block diagram of an encoding apparatus according to a first embodiment of this invention. This encoding apparatus has an input terminal of input samples, a blocking circuit 2, an orthogonal transformation circuit 3 whose output word length is m bits, a maxAC detection circuit 4 for detecting a value maxAC of the orthogonal components orthogonally transformed for every block, classified information 5 determined by the maxAC detection circuit 4, a re-arranging circuit 6 for re-arranging the orthogonal components in successive order from the lowest frequency component as shown in FIG. 2, a quantizer 7 for quantizing the orthogonal components from m to (m−1) bits, a switching circuit 8 for selecting the orthogonal components expressed by m bits or an orthogonal component quantized to (m−1) bits in accordance with the classified information 5, an adaptive quantizer 9 for quantizing the orthogonal components selected by the switching circuit 8 in accordance with the classified information 5, a variable length encoding circuit 10 for performing the variable length encoding of the data quantized by the adaptive quantizer 9 and adding the classified information 5 thereto in block unit and outputting, and an output terminal 11 of the variable length data thus encoded.

The operation of the encoding apparatus shown in FIG. 1 will be explained below. The orthogonal transformation circuit 3 performs the orthogonal transformation in block unit and outputs the results thus obtained with a word length of m bits. Successively, the re-arrangement of the orthogonal components thus transformed in carried out simultaneously with the detection of the max AC value thereof. In this case, the operation of the max AC detection circuit 4 will be explained first. The max AC detection circuit 4 detects the maximum value of the absolute value of the amplitudes of the orthogonal components excepting the direct-current component and classifies each block into four classes as shown in Table 1 in accordance with the maximum value thereof thus detected. In Tab. 1, A0, A1 and A2 each is a threshold of classification, and the order of their magnitudes is A0<A1<A2. Also, if the maximum value of the values max AC when the word length of the orthogonal components after orthogonal transformation is made of (m−1) bits is expressed as MAX (m−1), the A2 threshold is set so as to satisfy the following equation as;

$$A2 < MAX\ (m-1) \tag{1}$$

As a result, the block having the smallest dynamic range is classified into Class 0 and the block having the largest dynamic range is classified into Class 3. And, the blocks respectively classified in Classes 0, 1 and 2 are found from Equation (1) to be within the range where the dynamic range is expressed by (m−1) bits.

TABLE 1

| Class 0 | Class 1 | Class 2 | Class 2 |
|---------|---------|---------|---------|
| <A0 | A0≦, <A1 | A1≦, <A2 | A2≦ |

Next, quantization of the orthogonal components re-arranged by the re-arranging circuit 6 is carried out using the classified information 5 determined by the procedures as shown above. The method of quantizing them in accordance with the classified information 5 will be explained below.

Figure 3:
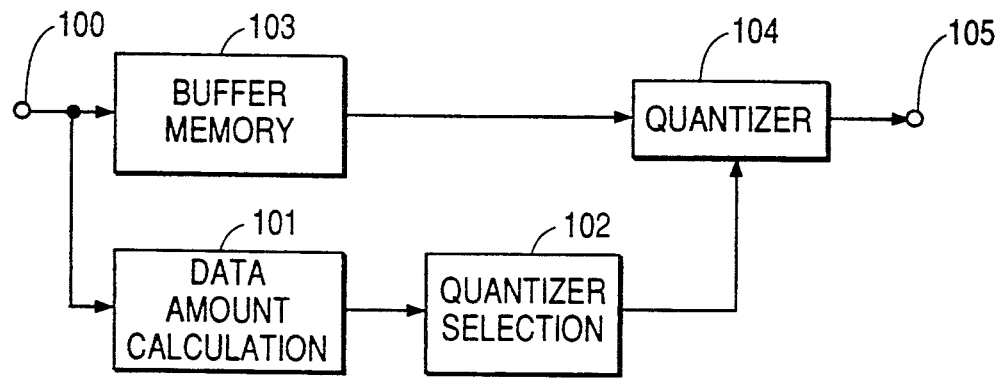
FIG. 3 is a block diagram of an adaptive quantizer circuit shown in FIG. 1.

One of the blocks classified in these four classes, for only those having the largest dynamic range classified into Class 3, the orthogonal components of m bits are quantized by the quantizer 7 to those of (m−1) bits. Such a process is carried out using the classified information 5, the quantizer 7 and the switching circuit 8. In which, for the blocks classified in Classes 0 to 2, the switching circuit 8 is switched to the upper side to select the components of m bits, and for the block classified in Class 3, it is switched to the lower side to select the components quantized to (m−1) bits. Next, thus selected components are quantized by the adaptive quantizer 9. The operation of the adaptive quantizer 9 will be concretely shown below. FIG. 3 concretely shows a typical arrangement of the adaptive quantizer 9 shown in FIG. 1.

In FIG. 3, 100 is an input terminal of the orthogonal components selected by the switching circuit 8, 101 is a data amount calculation circuit, 102 is a quantizer selection circuit, 103 is a buffer memory, 104 is a quantizer, and 105 an output terminal of the quantized data. The adaptive quantizer 9 collects plural blocks to form a group and quantizes the components in group unit so as not to exceed a predetermined data amount. Namely, the orthogonal components inputted from the input terminal 100 are stored in the buffer memory 102 and at the same time, are subjected to the calculation of data amount for a plurality of quantizers prepared in the data amount calculation circuit 101. Next, the quantizer selection circuit 102 selects an optimum quantizer based on the results thus calculated, and the quantization of them is carried out in the quantizer 104 using the optimum quantizer thus selected. Here, the classification of each block is already determined as shown above, so that different methods of quantization are sued in one group depending on the class. Table 2 shows an example of quantization method by class, in which the numerals at the left end indicate quantization steps and the numerals shown inside each indicates the number of bits of an output signal for the input signal of n bits. As a result, the quantization is carried out successively from the first step for each block of four classes, so that the quantization is carried out at the finest degree for the blocks classified in Class 0 and at coarser degrees for those classified in Classes 1, 2 and 3 in this order. Here, in Classes 0, 1 and 2, the input word length to the quantizer 7 is m bits and on the other hand, in Class 3, it is (m−1) bits, so that the actual output word lengths from the adaptive quantizer 9 becomes as shown in Table 3.

TABLE 2

|   | Class 0 | Class 1 | Class 2 | Class 3 |
|---|---------|---------|---------|---------|
| 1 | n | n | n | n |
| 2 | n | n | n | n − 1 |
| 3 | n | n | n − 1 | n − 2 |
| 4 | n | n − 1 | n − 2 | n − 3 |
| 5 | n − 1 | n − 2 | n − 3 | n − 4 |
| 6 | n − 2 | n − 3 | n − 4 | n − 4 |
| 7 | n − 3 | n − 4 | n − 4 | n − 4 |
| 8 | n − 4 | n − 4 | n − 4 | n − 4 |

TABLE 3

|   | Class 0 | Class 1 | Class 2 | Class 3 |
|---|---------|---------|---------|---------|
| 1 | m | m | m | m − 1 |
| 2 | m | m | m | m − 2 |
| 3 | m | m | m − 1 | m − 3 |
| 4 | m | m − 1 | m − 2 | m − 4 |
| 5 | m − 1 | m − 2 | m − 3 | m − 5 |
| 6 | m − 2 | m − 3 | m − 4 | m − 5 |
| 7 | m − 3 | m − 4 | m − 4 | m − 5 |

TABLE 3-continued

|   | Class 0 | Class 1 | Class 2 | Class 3 |
|---|---------|---------|---------|---------|
| 8 | m − 4   | m − 4   | m − 4   | m − 5   |

Finally, the data quantized by the adaptive quantizer 9 are encoded by the variable length encoding circuit 10, in which from Equation (1) and Tables 2 and 3, the dynamic range of the input data of the variable length encoder circuit 10 for each class ranges from − MAX (m−1) to + MAX (m−1). As a result, when considered upon the size of a table for encoding in the encoder circuit, it is not required to have a size accommodating to the dynamic range of an input with a word length of m bits, but enough to have a size accommodating to the dynamic range of an input with a word length of (m−1) bits.

As described above, according to the first embodiment, though the word length of the orthogonal components after orthogonal transformation are m bits, for the block whose dynamic range exceeds (m−1) bits, the quantization is carried out in advance so as to make it within the dynamic range of (m−1) bits, so that the dynamic range of an input to the variable length encoder circuit is limited, resulting in reducing the circuit scale thereof. In addition, for a block which has a small dynamic range and fine detail, it can be processed accurately with the word length of m bits.

Figure 4:
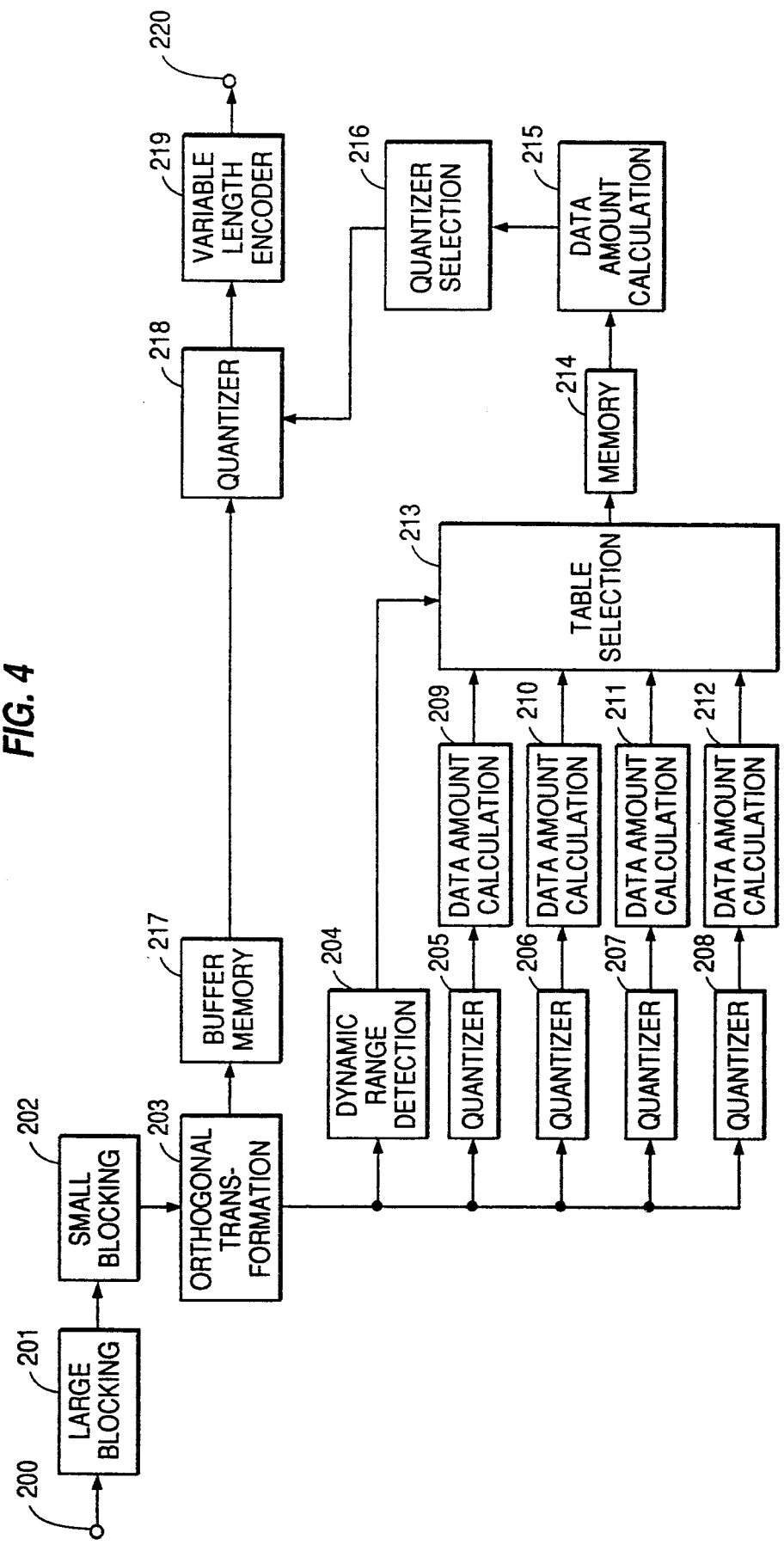
FIG. 4 is a block diagram of an encoding apparatus according to a second embodiment of this invention.

FIG. 4 is a block diagram of an encoding apparatus according to a second embodiment of this invention. This encoding apparatus has an input terminal 200 of inputted samples, a large blocking circuit 201, a small blocking circuit, 202 an orthogonal transformation circuit 203, a dynamic range detection circuit 204 for detecting a dynamic range of the orthogonal components orthogonally transformed for every block, quantizers 205, 206, 207 and 208 different in quantization width from each other, data amount calculation circuits 209, 210, 211 and 212 each for calculating the data amount when encoded the orthogonal components quantized for every small block by the corresponding one of the quantizers 205, 206, 207 and 208, a quantizer table selection circuit 213 for selecting from the tables prepared in advance one table comprising n quantizers having the quantizers 205, 206, 207 and 208 combinedly used in accordance with the detection result of dynamic range by the dynamic range detection circuit 204, a memory 214 for storing the data amount when quantized and encoded by the n quantizers selected by the quantizer table selection circuit 213, a data amount calculation circuit 215 for calculating the data amount of large block unit, a quantizer selection circuit 216 for selecting an optimum quantizer for every small block based on the calculation result of the data amount calculated by the data amount calculation circuit 215, a buffer memory 217 for delaying the orthogonal components until the optimum quantizer is determined, a quantizer 218 for quantizing the orthogonal components to be actually transmitted, a variable length encoder circuit 219, and an output terminal 220 of the data thus subjected to variable length encoding. The operation of the second embodiment will be explained below.

After orthogonal transformation in small block unit by the orthogonal transformation circuit 203, the dynamic range detection circuit 204 detects the dynamic range of the orthogonal components excepting the direct-current component and each small block is classified into any of the four classes according to the result thus detected. Thereafter, quantization method is switched in small block unit according to the class thus obtained, a concrete method of which will be shown below.

First, it is supposed that the blocks are classified into four classes consisting of Class a, Class b, Class c and Class d successively from the block having a smaller dynamic range, and the quantizers 205, 206, 207 and 208 are respectively expressed as Q1, Q2, Q3 and Q4 in which the quantization width is smallest of Q1 and it becomes larger in the order of Q2, Q3 and Q4. Next, by combining Q1, Q2, Q3 and Q4, a basic table is prepared which consists of 8-stages of quantizations as shown in Table 4. In the basic table as shown in Table 4, the quantizer has a finer quantization as the stage number becomes smaller. In actual quantization, based on the basic table shown in Table 4, an offset value is added in accordance with the block determined by the dynamic range detection circuit 204 thereto to prepare four kinds of tables as shown in Table 5, performing quantization using each kind of table. In Table 5, the table of Class d is equal to the basic table shown in Table 4, and in the order of Class c, Class b and Class a, it becomes a table having one offset value added additionally. Namely, the small block having smaller dynamic range is subjected to finer quantization, and on the other hand, the small block having larger dynamic range is subjected to coarser quantization.

TABLE 4

| 1 | Q1 |
| 2 | Q2 |
| 3 | Q2 |
| 4 | Q2 |
| 5 | Q3 |
| 6 | Q3 |
| 7 | Q3 |
| 8 | Q4 |

TABLE 5

|   | a  | b  | c  | d  |
|---|----|----|----|----|
| 1 | Q1 | Q1 | Q1 | Q1 |
| 2 | Q1 | Q1 | Q1 | Q2 |
| 3 | Q1 | Q1 | Q2 | Q2 |
| 4 | Q1 | Q2 | Q2 | Q2 |
| 5 | Q2 | Q2 | Q2 | Q3 |
| 6 | Q2 | Q2 | Q3 | Q3 |
| 7 | Q2 | Q3 | Q3 | Q3 |
| 8 | Q3 | Q3 | Q3 | Q4 |

Next, the table selection circuit 213 determines the data amount after encoding when quantization is made based on the table shown in Table 5 for all small blocks in a large block using the quantizers 209, 210, 211 and 212 in accordance with the class already determined and stores the result thus determined in the memory 214. For example, if a large block comprises k small blocks, a data amount of each small block as expressed as Sij (i; number of small block, j; quantizer to be used) in Tab. 6 is stored in the memory 214. In Table 6, the horizontal line indicates an arrangement of K small blocks and a class into which each of them is classified and the vertical line indicates the quantization steps shown in Table 5.

TABLE 6

|   | a       | b       | c       | d       |
|---|---------|---------|---------|---------|
|   | S (1,Q1)| S (2,Q1)| S (3,Q1)| S (k,Q1)|
|   | S (1,Q1)| S (2,Q1)| S (3,Q1)| S (k,Q2)|

TABLE 6-continued

| a | b | c | d |
|---|---|---|---|
| S (1,Q1) | S (2,Q1) | S (3,Q2) | S (k,Q2) |
| S (1,Q3) | S (2,Q3) | S (3,Q3) | S (k,Q4) |

From the data amount for every small block obtained as above, the data amount calculation circuit 215 calculates the data amount in large block unit and the quantizer selection circuit 216 compares the data amount in large block unit thus calculated with a data amount being set in advance to determine an optimum quantization width for every small block. Based on the quantization width thus obtained, the quantizer 218 quantizes the orthogonal components stored in the buffer memory 217 and the variable length encoder circuit 219 encodes them in a variable length manner.

As explained above, in accordance with the second embodiment, encoding is carried out by selecting a table consisting of n steps of quantization having m quantizers combined used, so that the quantization can be performed with a good accuracy using the small number of kinds of quantizers.

Figure 5:
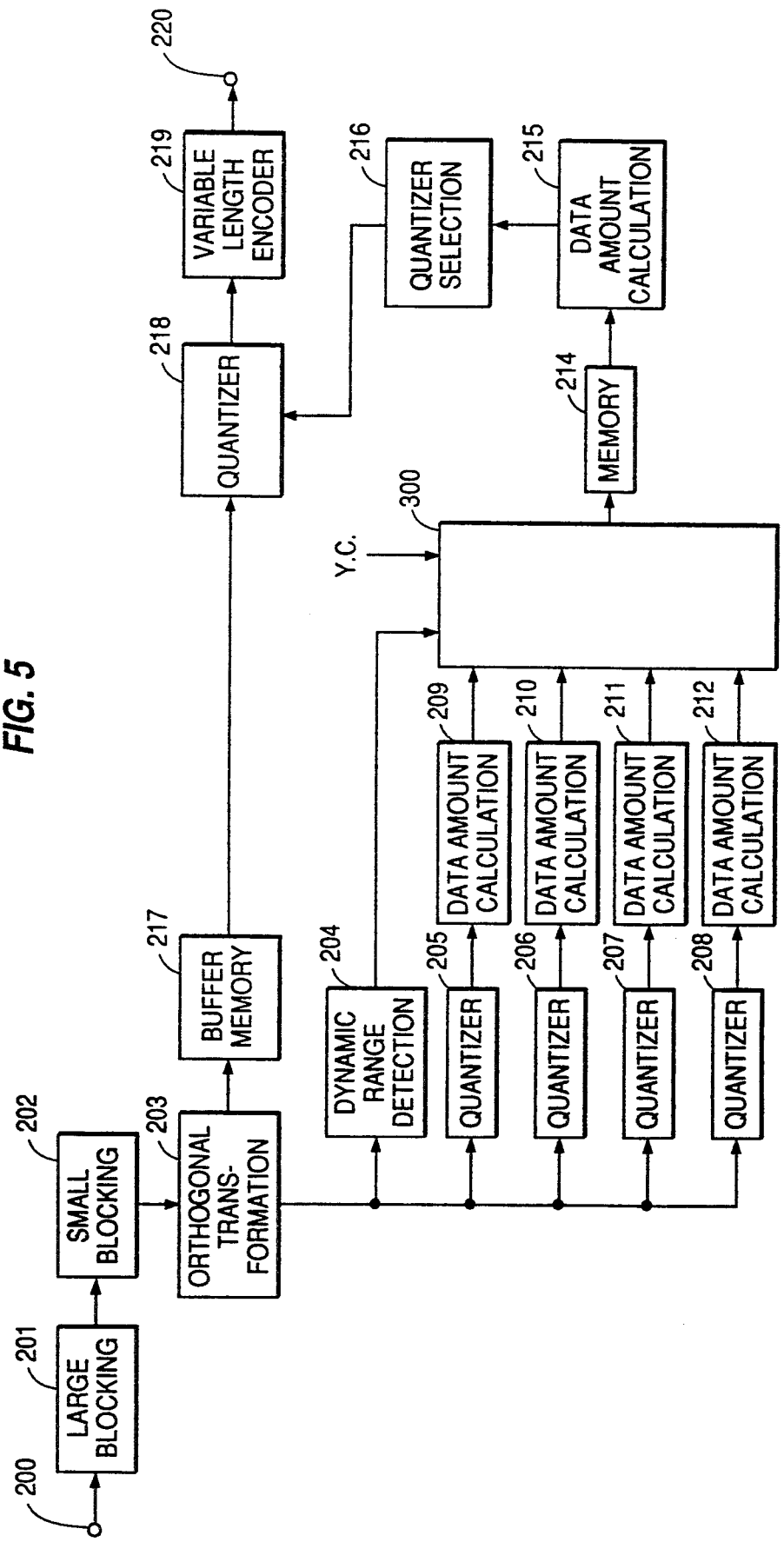
FIG. 5 is a block diagram of an encoding apparatus according to a third embodiment of this invention.

FIG. 5 is a block diagram of an encoding apparatus according to a third embodiment of this invention, in which the basic components to be used are the same as those of the second embodiment excepting that a table selection circuit 300 in this embodiment differs from the table selection circuit 214 in the second embodiment. Namely, in this embodiment, there takes a difference in the offset value between the cases when an input signal is classified in accordance with the dynamic range as a luminance signal and when it is classified in accordance with the dynamic range as a chrominance signal. For example, when the input signal is a luminance signal, the table shown in Table 5 is used and when it is a chrominance signal, the table shown in Table 7 is used. As a result, the chrominance signal is subjected to coarse quantization than the luminance signal.

TABLE 7

| | a | b | c | d |
|---|---|---|---|---|
| 1 | Q1 | Q1 | Q1 | Q1 |
| 2 | Q1 | Q1 | Q2 | Q2 |
| 3 | Q1 | Q2 | Q2 | Q2 |
| 4 | Q2 | Q2 | Q2 | Q2 |
| 5 | Q2 | Q2 | Q3 | Q3 |
| 6 | Q2 | Q3 | Q3 | Q3 |
| 7 | Q3 | Q3 | Q3 | Q3 |
| 8 | Q3 | Q3 | Q4 | Q4 |

As explained above, in accordance with this embodiment, as the chrominance signal is inconspicuous in visual deterioration compared with the luminance signal, the visual deterioration as the whole of an input signal is also inconspicuous.

Figure 6:
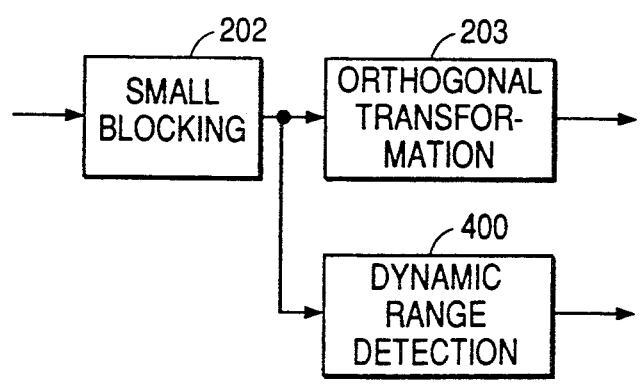
FIG. 6 is a block diagram showing another method of dynamic range detection.

In addition, FIG. 6 is a block diagram showing another method of the dynamic range detection, in which before performing orthogonal transformation, a dynamic range detection circuit 400 determines the dynamic range for every small block.

As described above, in accordance with this invention, encoding can be performed accurately with the reduced number of kinds of quantizer, resulting in providing great practical effects.

What is claimed is:

1. An encoding apparatus comprising:
    blocking means for collecting sampled values of an input signal to obtain blocks of sampled values;
    orthogonal transformation means for orthogonally transforming sampled values of each block to obtain orthogonal components;
    detection means for detecting amplitudes of components excepting a direct-current component out of the orthogonal components obtained by said orthogonal transformation means;
    first quantization means for quantizing said orthogonal components only when an amplitude detected by said detection means exceeds a predetermined value;
    second quantization means for quantizing data obtained by said first quantization means in accordance with the amplitudes detected by said detection means; and encoder means for encoding data obtained by said second quantization means.

2. An encoding apparatus as claimed in claim 1 wherein said detection means detects the orthogonal components simultaneously with the re-arrangement thereof by said orthogonal transformation means.

3. An encoding apparatus as claimed in claim 1, wherein said detection means detects a maximum value of absolute values of the amplitudes of the components excepting the direct-current component out of the orthogonal components obtained by said orthogonal transformation means.

4. An encoding apparatus as claimed in claim 1, wherein said encoding means inserts information on the amplitudes in said block.

5. An encoding apparatus as claimed in claim 1, wherein said orthogonal transformation means re-arranges the orthogonal components after orthogonal transformation.

6. An encoding apparatus as claimed in claim 5, wherein said detection means detects the orthogonal components simultaneously with the re-arrangement thereof by said orthogonal transformation means.

7. An encoding apparatus comprising:
    large blocking means for collecting sampled values of an input signal to obtain large blocks of sampled values; small blocking means for dividing each large block into a plurality of small blocks;
    orthogonal transformation means for orthogonally transforming each of said plurality of small blocks to obtain orthogonal components;
    m quantization means for quantizing the orthogonal components obtained by said orthogonal transformation means with m kinds of quantization widths;
    quantization means table selection means for selecting one of a plurality of quantization means tables each showing a combination of n stages of quantization means selected from said m quantization means for each small block;
    data amount calculation means for calculating data amount after quantization of each small block by the n stages of quantization means;
    quantization means selection means for selecting, using the data amount obtained by said data amount calculation means, an optimum quantization width for each small block to make a data amount constant in every large block;
    quantization means for quantizing said orthogonal components using said optimum quantization width selected by said quantization means selection means; and
    encoder means for encoding quantized values obtained by said quantization means.

8. An encoding apparatus as claimed in claim 7, wherein said quantization means table selection means selects a different quantization means depending on whether said input signal is either a luminance signal or a chrominance signal.

9. An encoding apparatus as claimed in claim 7, wherein said quantization means table selection means selects a quantization means table in accordance with dynamic range of each of said plurality of small blocks before or after orthogonal transformation.

10. An encoding apparatus as claimed in claim 9, wherein said quantization means table selection means selects a different quantization means depending on whether said input signal is either a luminance signal or a chrominance signal.

* * * * *